United States Patent
Sung et al.

(10) Patent No.: US 7,493,510 B2
(45) Date of Patent: Feb. 17, 2009

(54) CLOCK SIGNAL GENERATOR CIRCUIT FOR SERIAL BUS COMMUNICATION

(75) Inventors: Hyuk-Jun Sung, Yongin-si (KR); Chan-Yong Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 400 days.

(21) Appl. No.: 11/091,427

(22) Filed: Mar. 28, 2005

(65) Prior Publication Data

US 2005/0216780 A1    Sep. 29, 2005

(30) Foreign Application Priority Data

Mar. 29, 2004 (KR) ............ 10-2004-0021285

(51) Int. Cl.
*G06F 1/08* (2006.01)
(52) U.S. Cl. .................. 713/503; 713/501; 327/156
(58) Field of Classification Search ............... 713/503, 713/501; 327/156
See application file for complete search history.

(56) References Cited

U.S. PATENT DOCUMENTS

| | | | |
|---|---|---|---|
| 6,223,298 B1 * | 4/2001 | Tellier et al. | ............ 713/501 |
| 6,343,364 B1 | 1/2002 | Leydier et al. | |
| 6,621,353 B2 * | 9/2003 | Bronson et al. | ............ 331/1 A |
| 2001/0011914 A1 | 8/2001 | Pomet | ............ 327/165 |
| 2002/0062457 A1 * | 5/2002 | Kamihara | ............ 713/600 |
| 2003/0054782 A1 | 3/2003 | Snider | |

FOREIGN PATENT DOCUMENTS

| | | |
|---|---|---|
| DE | 10041772 A1 | 3/2002 |
| EP | 1 118 943 A1 | 7/2001 |
| JP | 2002-198785 | 12/2002 |
| KR | 2003-0038706 | 5/2003 |

* cited by examiner

*Primary Examiner*—Thuan N Du
(74) *Attorney, Agent, or Firm*—F. Chau & Assoc., LLC

(57) ABSTRACT

Provided is a smart card for communicating with a host computer through a universal serial bus (USB). The smart card includes an internal clock signal generator to generate an internal clock signal, a period detector to detect a period of the internal clock signal and to generate a control code according to the detected period, and a transmission clock generator to generate a transmission clock signal which varies from the internal clock signal according to the control code. The smart card transfers data in sync with the transmission clock signal.

20 Claims, 13 Drawing Sheets

Fig. 12

| T1 | T2 | CNT=<br>(666.6ns/T2)X6 | T1/10.41ns | N+K/F |
|---|---|---|---|---|
| 84ns | 10.5ns | 381 | 8.096 | 8+18/256 |
| 84.4ns | 10.55ns | 380 | 8.108 | 8+28/256 |
| | | 379 | | 8+33/256 |
| 84.8ns | 10.60ns | 378 | 8.146 | 8+37/256 |
| | | 377 | | 8+42/256 |
| 85.2ns | 10.65ns | 376 | 8.184 | 8+47/256 |
| | | 375 | | 8+52/256 |
| 85.6ns | 10.70ns | 374 | 8.223 | 8+57/256 |
| 86.0ns | 10.75ns | 373 | 8.261 | 8+67/256 |
| | | 372 | | 8+72/256 |
| 86.4ns | 10.80ns | 371 | 8.3 | 8+77/256 |
| | | 370 | | 8+82/256 |
| 86.8ns | 10.85ns | 369 | 8.338 | 8+87/256 |
| | | 368 | | 8+92/256 |
| 87.2ns | 10.90ns | 367 | 8.377 | 8+96/256 |
| 87.6ns | 10.95ns | 366 | 8.415 | 8+106/256 |
| | | 365 | | 8+111/256 |
| ⋮ | | | | |
| 109.2ns | 13.65ns | 294 | 10.490 | 10+125/256 |
| | | 293 | | 10+130/256 |
| 109.6ns | 13.70ns | 292 | 10.528 | 10+135/256 |
| 110.0ns | 13.75ns | 291 | 10.567 | 10+145/256 |
| 110.4ns | 13.80ns | 290 | 10.605 | 10+155/256 |
| 110.8ns | 13.85ns | 289 | 10.644 | 10+165/256 |
| 111.2ns | 13.90ns | 288 | 10.682 | 10+175/256 |
| 111.6ns | 13.95ns | 287 | 10.720 | 10+184/256 |
| 112ns | 14.00ns | 286 | 10.759 | 10+194/256 |

Fig. 13

```
Generate I_CLK                      —S400
        ↓
Detect I_CLK period from CNT        —S410
        ↓
Generate N & K                      —S420
        ↓
Frequency_divide I_CLK by pa+b      —S430
        ↓
Generate USB_TX_CLK                 —S440
```

Fig. 14

| Frequency of I_CLK | Sampling pulse # | Frequency Division ratio N+(K/F) |
|---|---|---|
| Increase | Decrease | Increase |
| Decrease | Increase | Decrease |

CLOCK SIGNAL GENERATOR CIRCUIT FOR SERIAL BUS COMMUNICATION

CROSS-REFERENCE TO RELATED APPLICATION

This U.S. non-provisional patent application claims priority under 35 U.S.C. § 119 to Korean Patent Application 2004-21285 filed on Mar. 29, 2004, the entire contents of which are herein incorporated by reference.

TECHNICAL FIELD

The present invention relates to communication through a data bus, and in particular, to a transmission clock signal generator circuit for use in an electronic device that communicates with a host computer through a serial bus.

DISCUSSION OF THE RELATED ART

An integrated circuit (IC) card, for example, a micro computer, may be implemented to form a thin semiconductor chip on a credit card sized plastic card. The IC card is more stable and has a higher level of security than a typical magnetic card having a magnetic stripe because it is much easier to extract data from a magnetic card than from an embedded IC card. Thus, IC cards are finding increasing use as multimedia storage devices.

IC cards are typically shaped and dimensioned like conventional magnetic stripe cards. There are several types of IC cards. For example, there are contact IC cards, wireless contactless IC cards, and Remote Coupling Communication Cards (RCCCs). The ISO/IEC (International Standard Organization/International Electrotechnical Commission) 14443 standard is used by a proximity type contactless card to define protocols for physical characteristics, radio frequency (RF) power supply, signal coupling, initialization, and collision prevention. According to the ISO/IEC 14443 standard, the contactless IC card includes an IC for performing processing and/or memory functions. The contactless IC card also exchanges signals and receives a power supply voltage through inductive coupling with a proximity-coupling device such as a card reader, without having to use a galvanic element. When the card reader is coupled with the contactless IC card it produces an RF energy field, and transfers the power supply voltage to the contactless IC card. A frequency $f_C$ of an RF signal produced by the card reader when coupled to the contactless IC card is, for example 13.56 MHz±7 kHz. An IC card that has a central processing unit (CPU) for processing data is known as a smart card.

A universal serial bus (USB) has been developed to standardize the interface between a computer and peripheral devices such as a mouse, printer, modem, and speaker. The USB is now a standard interface that is made available with nearly each personal computer (PC) sold in the marketplace.

A typical data transmission speed of a serial port is limited to about 100 Kbps, whereas a maximum data transmission speed of the USB is about 12 Mbps. Accordingly, the data transmission speed of the USB is sufficient to connect peripheral devices to a PC. For example, the USB can connect 127 devices to each other in the form of a chain. When a connection from a peripheral device to a USB port is made while using a PC, an indication that the connection has been made is possible even when the peripheral device does not have its own power supply. In addition, when the USB port is used to connect peripheral devices to a PC, the peripheral devices may be coupled with the same coupler without needing additional setting software or hardware. Thus, allowing the number of ports and a size of a portable PC to be reduced. Further, mounting a USB port to a portable PC is relatively simple.

Currently, as applications for IC cards increase, a demand for communicating between a host computer and an IC card through a USB port also increases. For full-speed USB communication, a stable clock signal of 12 MHz±0.25% is required. Thus, because devices such as PCs, PDAs, portable phones, and digital cameras produce a stable clock signal by means of an oscillator, they can support full-speed USB operation. In general, the IC card, which does not include an oscillator, operates in response to received clock signals. In order to communicate with a host computer using the USB, the IC card should have a clock generator for data communication therein. However, it is difficult to stabilize an oscillator such as a crystal oscillator therein. Accordingly, a need therefore exists for an oscillator for use on an IC card capable of producing stable clock signals for serial bus communication.

SUMMARY OF THE INVENTION

An aspect of the present invention is to provide a clock signal generator circuit comprising: a first clock generator for generating a first clock signal; a period detector for detecting a period of the clock signal from the first clock generator, and for generating a control code according to the detected result; and a second clock generator circuit for receiving the first clock signal from the first clock generator, and for generating a second clock signal according to the control code from the period detector.

The period detector includes: a sampling clock signal generator for receiving the first clock signal from the first clock signal generator and for generating a plurality of sampling clock signals having different phases; and control logic for sampling a synchronous signal from a host computer by using the sampling clock signals from the sampling clock signal generator, and for generating a control code corresponding to the sampled result.

Each of the sampling clocks has a frequency higher than that of the first clock signal. The control logic includes means for storing a plurality of control codes. The control logic outputs a control code corresponding to the sampled result among the plurality of control codes.

The second clock generator includes a phase locked loop (PLL) circuit for frequency-dividing the first clock signal by a frequency division ratio corresponding to the control code and for outputting the divided clock signal as a clock signal. The PLL circuit is a fractional PLL circuit.

The frequency division ratio includes a coefficient N (where N is a positive integer) corresponding to an integer frequency division ratio and a coefficient K (where K is a positive integer) corresponding to a fractional frequency division ratio. A frequency division ratio of the fractional PLL circuit is N+(K/F) (where N, K, and F are integers). The first clock generator is a resistor-capacitor (RC) oscillator.

In accordance with a further aspect of the present invention, there is provided an electronic device comprising: a first clock generator for generating a first clock signal; a sampling clock signal generator for receiving the first clock signal from the first clock generator and for generating a plurality of sampling clock signals having different phases; a control logic for sampling a synchronous signal from a host computer by using the sampling clock signals from the sampling clock signal generator, and for generating a control code corresponding to the sampled result; and a second clock generator for receiving the first clock signal from the first clock generator, and for generating a second clock signal according to the control code from the control logic.

The second clock generator includes a fractional PLL circuit for multiplying the first clock signal a real number of times by a frequency division ratio corresponding to the control code and for outputting a clock signal having a predetermined frequency. The electronic device is an integrated circuit (IC) card.

In accordance with another aspect of the present invention, there is provided an IC card for communicating with a host computer through a serial bus, the integrated circuit card comprising: a first clock generator for generating a first clock signal; a period detector for detecting a period of the first clock signal from the first clock generator, and for generating a control code according to the detected result; and a second clock generator for receiving the first clock signal from the first clock generator, and for generating a second clock signal according to the control code from the period detector.

The control logic outputs a control code among the plurality of control codes corresponding to a sum of a pulse number of the sampling clock signals while the synchronous signal is at a first level. The serial bus is a Universal Serial Bus (USB). The IC card is a smart card.

In accordance with yet another aspect of the present invention, there is provided a smart card for communicating with a host computer through a serial bus, the smart card comprising: a receiver for receiving a synchronous signal from the host computer through the serial bus; a clock signal generator circuit for receiving the synchronous signal and for generating a transmission clock signal; and a transmitter for transmitting data to the host computer through the serial bus in synchronism with the transmission clock signal from the clock signal generator, wherein the clock signal generator circuit includes: an internal clock generator for generating an internal clock signal; a period detector for detecting a period of the internal clock signal from the internal clock generator, and for generating a control code according to the detected result; and a transmission clock generator for receiving the internal clock signal from the internal clock generator, and for generating a transmission clock signal according to the control code from the period detector.

The period detector includes: a first PLL circuit for receiving the internal clock signal from the internal clock generator and for generating a plurality of sampling clock signals having different phases; counters for counting periods of the sampling clock signals from the first PLL circuit during an activation interval of the synchronous signal; an adder for adding the periods of the sampling clock signals counted by the counters; and control logic for outputting the control code corresponding to an output of the adder.

The first PLL circuit is an integer PLL circuit, and includes a differential ring oscillator for generating a plurality of sampling clock signals having different phases. Each frequency of the sampling clock signals is higher than that of the internal clock signal. The second clock generator includes a second PLL circuit for frequency-dividing the internal clock signal by a frequency division ratio corresponding to the control code, and is a fractional PLL circuit.

A method for generating clocks according to the present invention comprises the steps of: generating an internal clock signal; detecting a period of the internal clock signal and generating a control code according to the detected result; and receiving the internal clock signal and generating a transmission clock signal according to the control code.

A method for controlling a smart cart that communicates with a host computer through a serial bus according to the present invention comprises the steps of: receiving a synchronous signal from the host computer through the serial bus; generating an internal clock signal; detecting a period of the internal clock signal by using the synchronous signal, and generating a control code according to the detected result; receiving the internal clock signal, and multiplying the received internal clock signal by a ratio according to the control code to generate a constant clock signal; and transmitting data to the host computer through the serial bus in synchronism with the transmission clock signal.

BRIEF DESCRIPTION OF THE DRAWINGS

The above and other features of the present invention will become more apparent by describing in detail preferred embodiments thereof with reference to the attached drawings, in which:

FIG. 12 is a table of division ratios arranged according to frequencies of an internal clock signal generated by an internal clock source shown in FIG. 6;

FIG. 13 is a flowchart showing a method for generating a transmission clock signal according to yet another preferred embodiment of the present invention;

FIG. 14 is a table showing changes of a number of sampling pulses and a frequency division ratio according to a frequency of an internal clock signal generated by the internal clock source shown in FIG. 6.

DETAILED DESCRIPTION OF PREFERRED EMBODIMENTS

Figure 1:
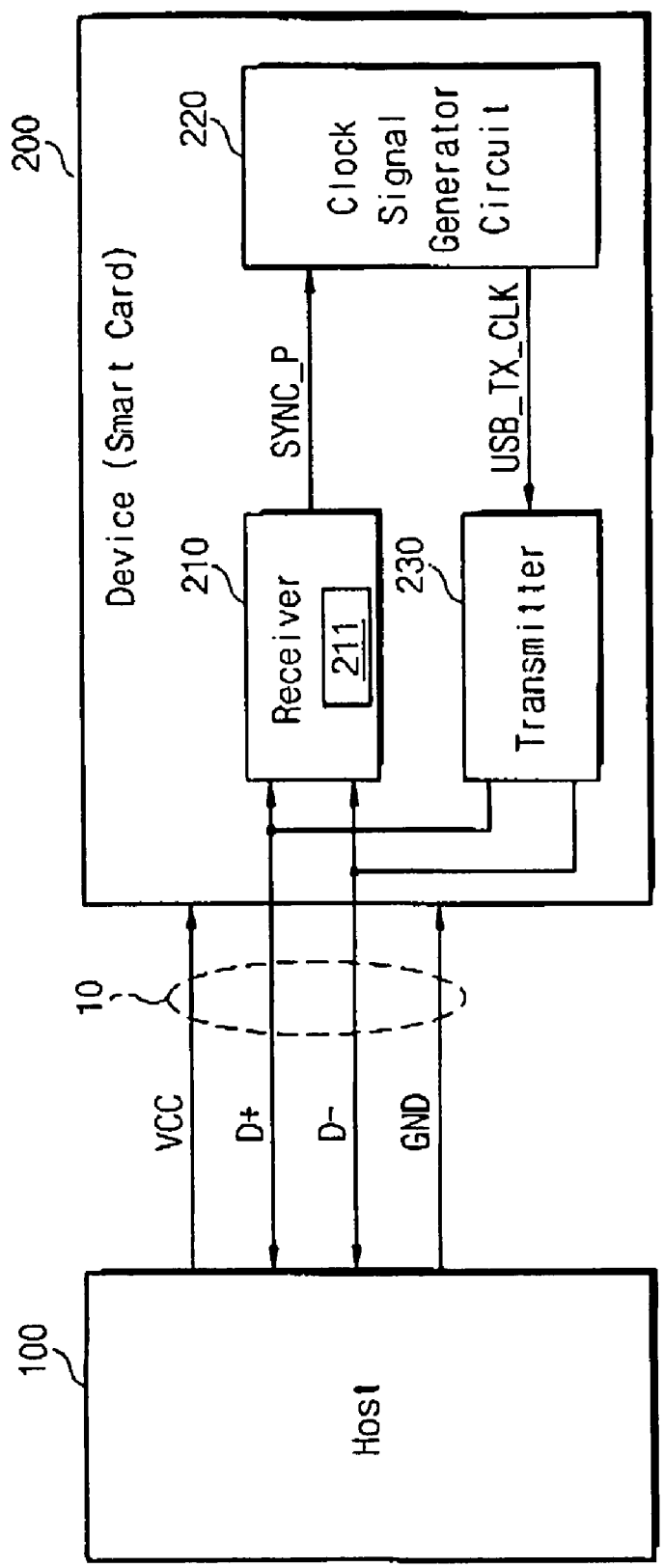
FIG. 1 illustrates a smart card that is coupled with a host computer through a universal serial bus (USB) according to a preferred embodiment of the present invention.

FIG. 1 illustrates a smart card 200 that is coupled with a host computer 100 through a universal serial bus (USB) 10 according to a preferred embodiment of the present invention. The host computer 100 may be, for example, a personal computer (PC), notebook computer, personal digital assistant (PDA), camcorder, digital camera, or portable phone. Although the description to be given below illustrates the smart card 200 as an integrated circuit (IC) card coupled with the host computer 100, the smart card 200 can be any electronic device that does not have an oscillator for generating stable clock signals.

With reference to FIG. 1, the USB 10 transmits signals and a power source through a four-wire cable. For example, the power source is transferred from the host computer 100 to the smart card 200 through power supply lines VCC and GND. The signals are transmitted between two signal lines D+ and D−. Although the communication between the host computer 100 and the smart card 200 to be described below will be with respect to full-speed data transmission between the host computer 100 and the smart card 200, various data transmission speeds may be used between the host computer 100 and smart card 200.

When the smart card 200 accesses the host computer 100, a USB protocol according to, for example, the USB 2.0 standard, defines a control transfer for setting the coupling between the host computer 100 and the smart card 200. The control transfer is divided into a setup phase, a data phase, and a handshake phase.

Figure 2:
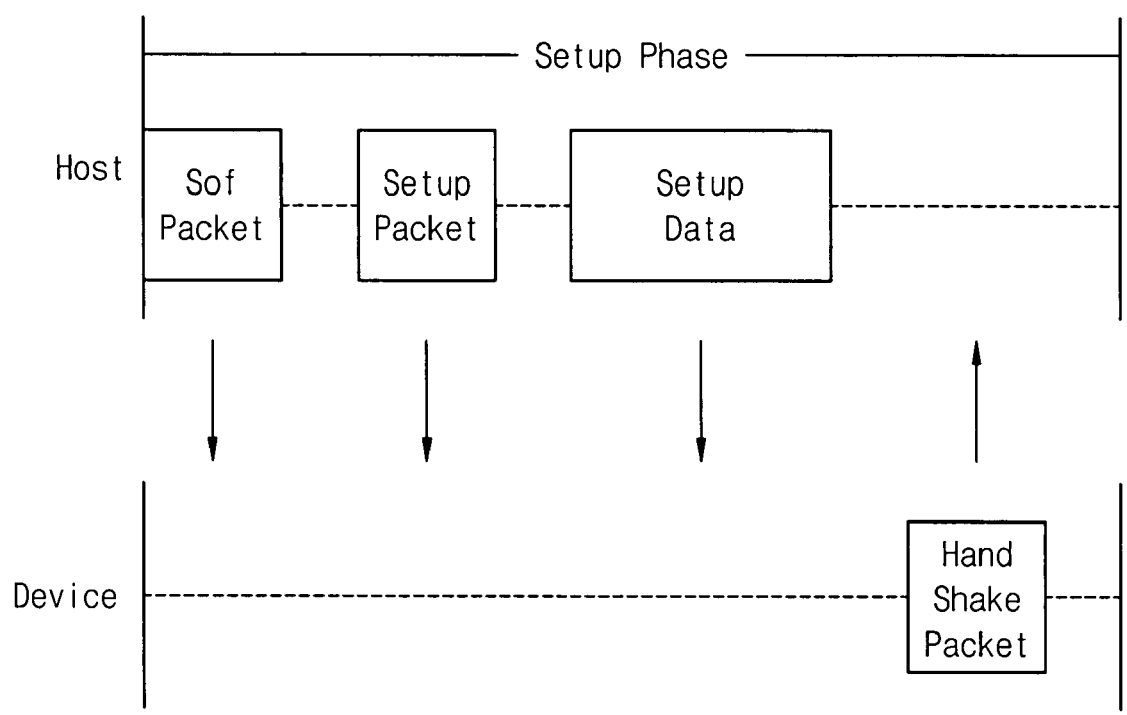
FIG. 2 illustrates a data transceiving operation between a host computer and a device in a setup phase.
Figure 3:
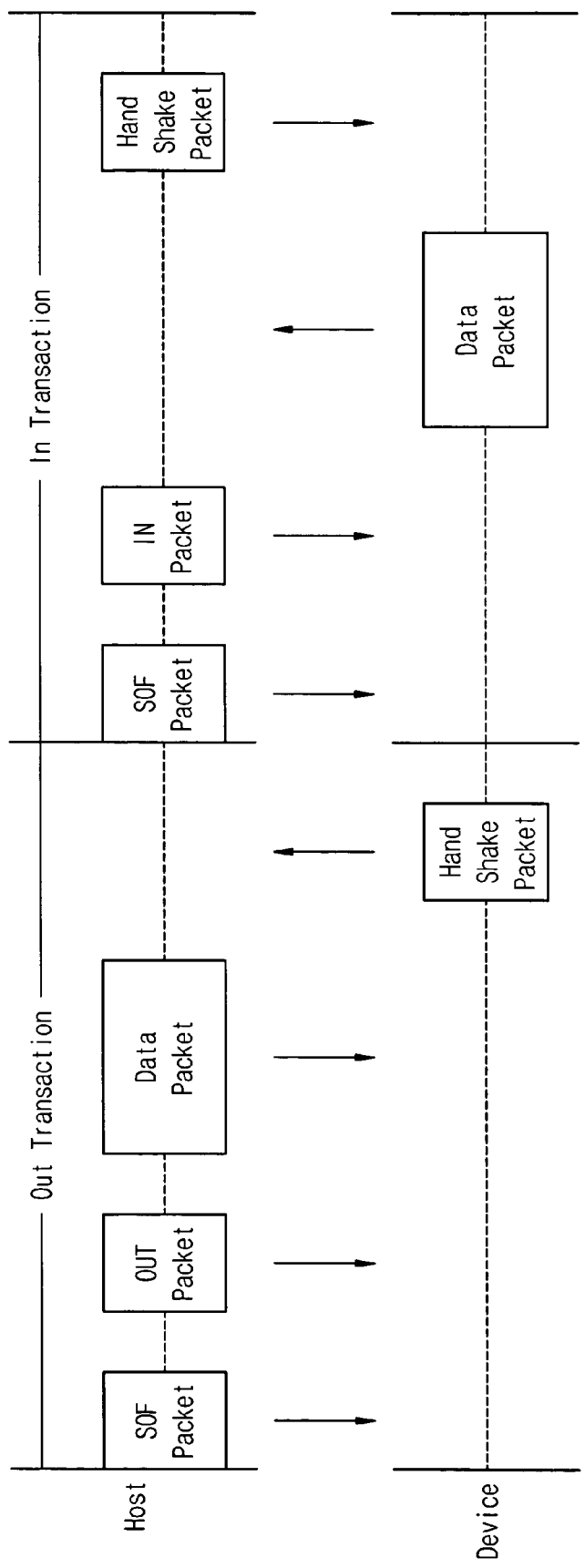
FIG. 3 illustrates an OUT transaction for transmitting data from the host computer to the device, and an IN transaction for transmitting data from the device to the host computer.

FIG. 2 shows a data transceiving operation between the host computer 100 and a device 200 in a setup phase. FIG. 3 illustrates an OUT transaction for transmitting from the host computer 100 to the device 200, and an IN transaction for transmitting from the device 200 to the host computer 100 during the transceiving operation of FIG. 2. As shown in FIGS. 2 and 3, in order to perform the data transceiving operation between the host computer 100 and the device 200, a packet transmission signal such a start of frame (SOF), SETUP, IN, or OUT is transmitted from the host computer 100 to the device 200 before the transceiving operation. At the head of each packet, as shown, for example, in FIG. 4, a synchronous pattern is arranged. A synchronous pattern for the full-speed transmission includes 8 symbol intervals.

Figure 4:
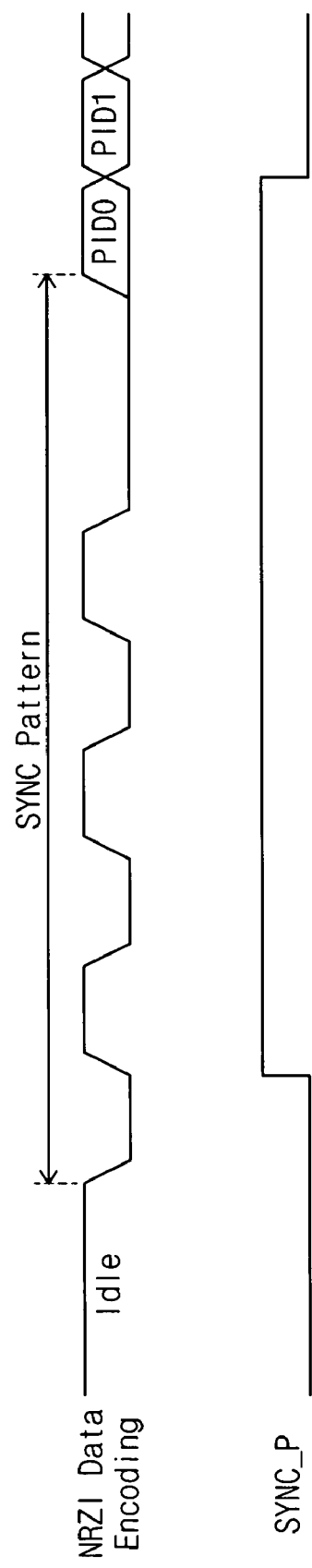
FIG. 4 illustrates a synchronous pattern signal.

As shown in FIG. 1, a receiver 210 of the smart card 200 detects a synchronous pattern provided from the host computer 100, and outputs a synchronous pattern signal SYNC_P also shown in FIG. 4. The receiver 210 includes a restoring circuit 211 that produces a clock signal, which is twice the speed of a regulated clock signal, and restores a data signal received from the host computer 100.

The smart card 200 also includes a clock signal generator circuit 220 for generating a stable transmission clock signal USB_TX_CLK. For example, the clock signal generator circuit 220 generates an internal clock signal, detects a period of the generated clock signal based on the synchronous pattern signal SYNC_P, and generates the stable transmission clock signal USB_TX_CLK according to the detected result. The smart card 200 further includes a transmitter 230 that transmits a data signal to the host computer 100 that is synchronized with the stable transmission clock signal USB_TX_CLK received from the clock signal generator circuit 220.

Figure 5:
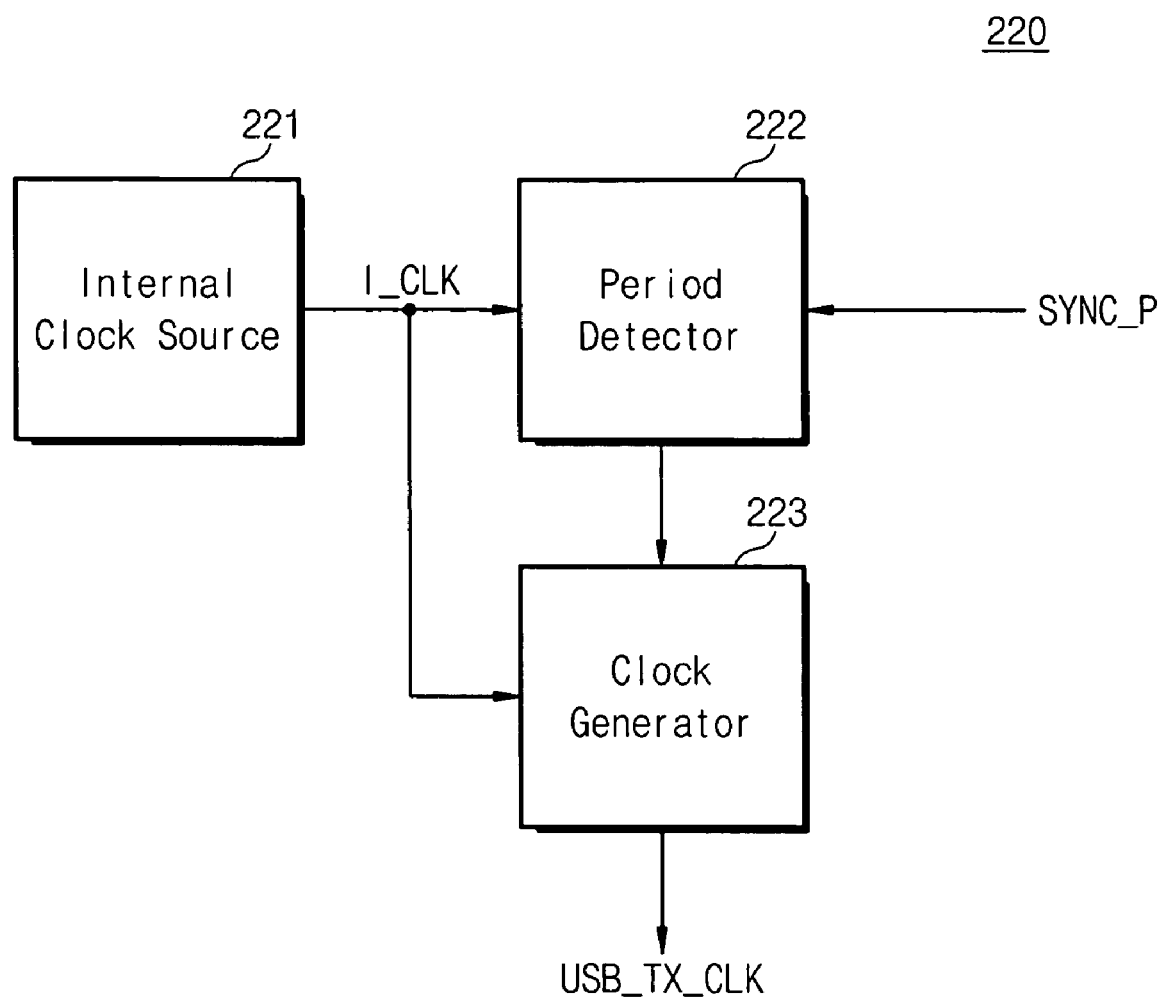
FIG. 5 illustrates a clock signal generator circuit shown in FIG. 1.

FIG. 5 illustrates the clock signal generator circuit 220 shown in FIG. 1. Referring to FIG. 5, the clock signal generator circuit 220 includes an internal clock source 221, a period detector 222, and a clock generator 223. The internal clock source 221 is composed of, for example, a resistor-capacitor (RC) oscillator, and generates an internal clock signal I_CLK. In addition to the RC oscillator, the internal clock source 221 is composed of any type of oscillator that can be used by an IC. The period detector 222 detects a period of the internal clock signal I_CLK transmitted from the internal clock source 221 based on the synchronous pattern signal SYNC_P, and generates a control code according to the detected result. The clock generator 223 receives the internal clock signal I_CLK, and generates the transmission clock signal USB_TX_CLK which is adjusted according to a control code. The transmission clock signal USB_TX_CLK is transferred to the transmitter 230 shown in FIG. 1.

Figure 6:
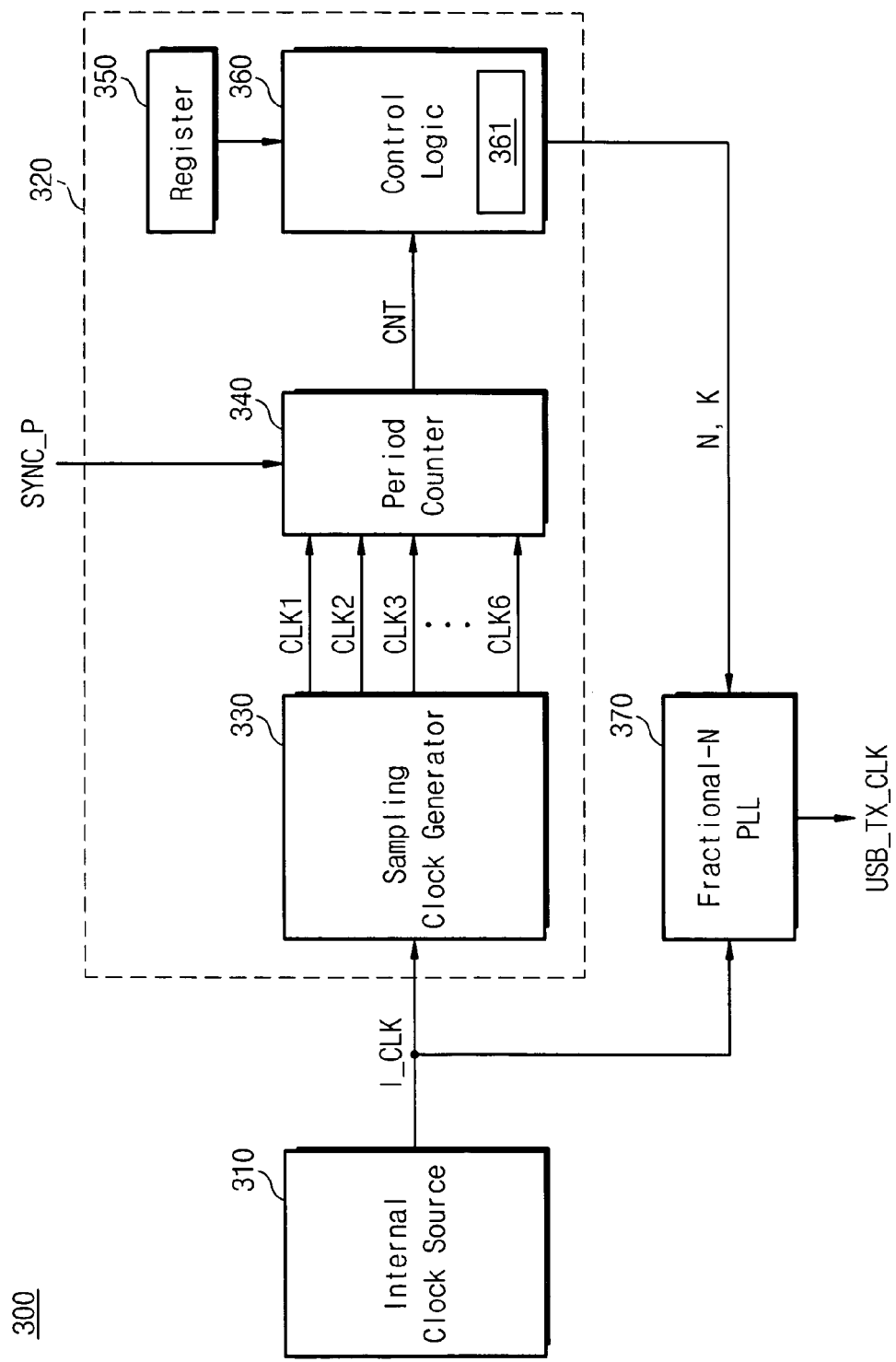
FIG. 6 illustrates a clock signal generator circuit including a period detector according to another preferred embodiment of the present invention.

FIG. 6 illustrates a clock signal generator circuit 300 including a period detector 320. As shown in FIG. 6, an internal clock source 310 may be an RC oscillator. A percentage error of the RC oscillator is typically ±15%. For example, if the internal clock source 310 is designed to generate a clock signal of 10.41 MHz, it will actually generate an internal clock signal I_CLK of 10.41 MHz±15%, where the percentage of error compensates for external circumstances such as temperature. A clock signal having a large deviation is unsuitable for USB transmission. Thus, the clock signal generator circuit 300 converts and outputs an internal clock signal I_CLK having a large deviation generated by the internal clock source 310 into a clock signal within a range of 12 MHz±0.25% defined by, for example, the USB 2.0 standard by using a synchronous pattern provided from a host computer.

Figure 7:
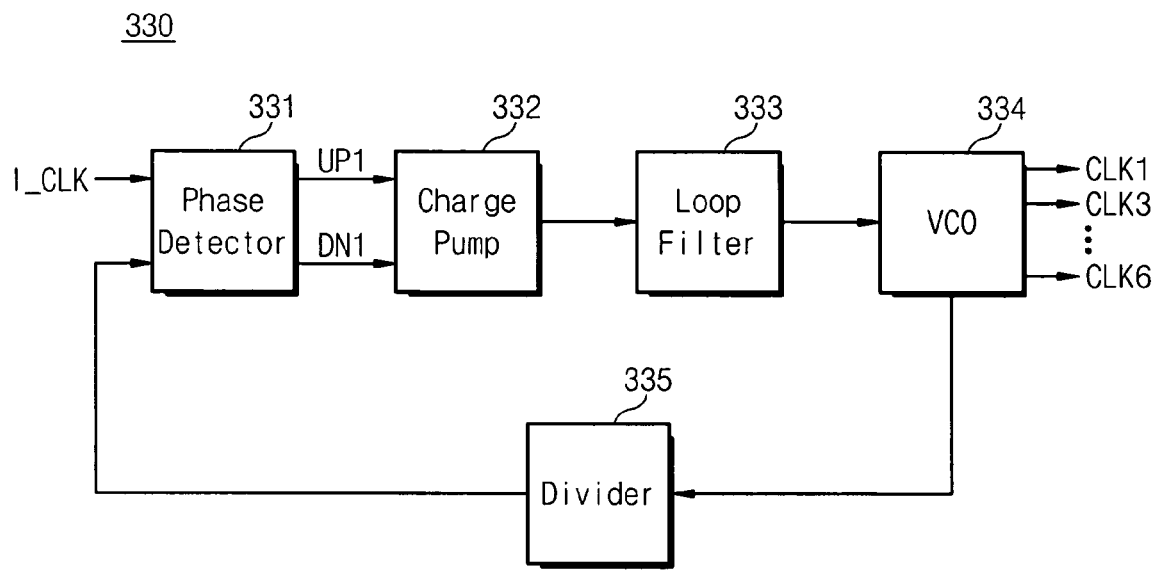
FIG. 7 illustrates a multiple phase generator of the period detector shown in FIG. 6.

The period detector 320 includes a multiple phase generator (e.g., a sampling clock generator) 330, a period counter 340, a register 350, and control logic 360. FIG. 7 illustrates the multiple phase generator 330 shown in FIG. 6. With reference to FIG. 7, the multiple phase generator 330 includes a phase detector 331, a charge pump 332, a loop filter 333, a voltage controller oscillator (VCO) 334, and a frequency divider 335.

As shown in FIG. 7, the phase detector 331 compares a phase of the internal clock signal I_CLK generated by the internal clock source 310 with that of a clock signal outputted from the frequency divider 335, and outputs phase difference signals UP1 and DN1 corresponding to the phase difference thereof. The charge pump 332 adjusts a charge that is supplied to the loop filter 333 according to the phase difference signals UP1 and DN1 from the phase detector 331. The loop filter 333 generates a direct current (DC) voltage proportional to the charge received from the charge pump 332. The VCO 334 outputs a clock signal having a frequency corresponding to the DC voltage from the loop filter 333. The frequency divider 335 frequency-divides the clock signal outputted from the VCO 334 by 8. The VCO 334 further outputs six sampling clock signals CLK1~CLK6 having different phases.

Figure 8:
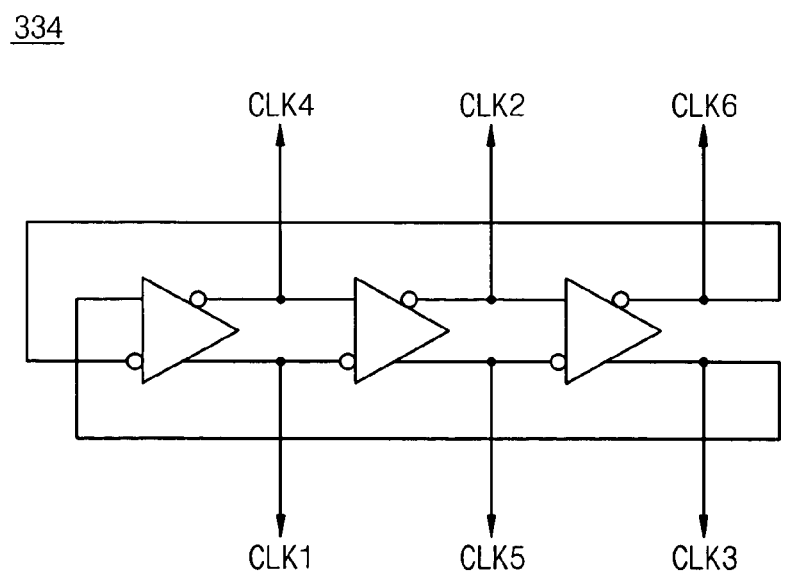
FIG. 8 illustrates a voltage-controlled oscillator (VCO) of the multiple phase generator shown in FIG. 7.

As shown in FIG. 8, the VCO 334 is a differential ring oscillator. The six sampling clock signals CLK1~CLK6 have the same frequency and different phase's during one period. A phase, for example Phase_CLKn, of the sampling clock signals CLK1_CLK6, is expressed by following equation.

$$\text{Phase\_}CLKn = SIN((2\pi*(8*I\_CLK)*t) + n\pi/3) \quad \text{[Equation 1]}$$

where, n=0, 1, 2, 3, 4, 5

Figure 10:
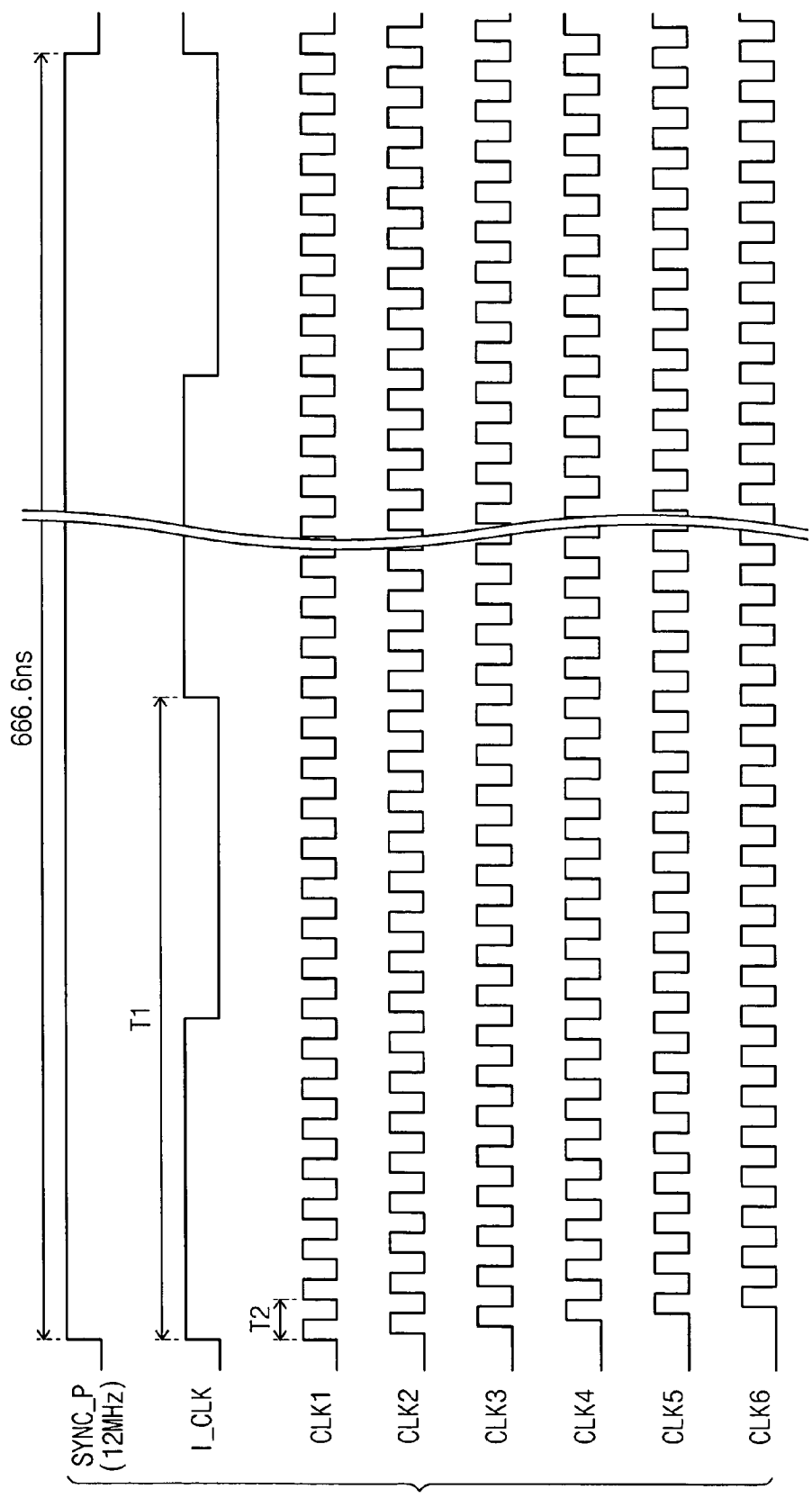
FIG. 10 illustrates the synchronous pattern signal and sampling clock signals.

Although the number of clock signals shown being outputted from the VCO 334 is six, the number of clock signals outputted can be varied according to a frequency of the internal clock signal I_CLK generated by the internal clock source 310 and a frequency division ratio of the multiple phase generator 330. FIG. 10 is a timing chart of the synchronous pattern signal SYNC_P and the sampling clock signals CLK1~CLK6.

Returning to FIG. 6, in order to detect a period of the internal clock signal I_CLK, the period counter 340 counts the pulse number of the six sampling clock signals CLK1~CLK6 from the multiple phase generator 330 while the synchronous pattern signal SYNC_P is a logic '1' and outputs a sum CNT of the counted pulse number of the six sampling clock signals CLK1~CLK6. The synchronous pattern signal SYNC_P is a logic '1' during 8 symbol intervals and has a period of 666.6 ns.

Figure 9:
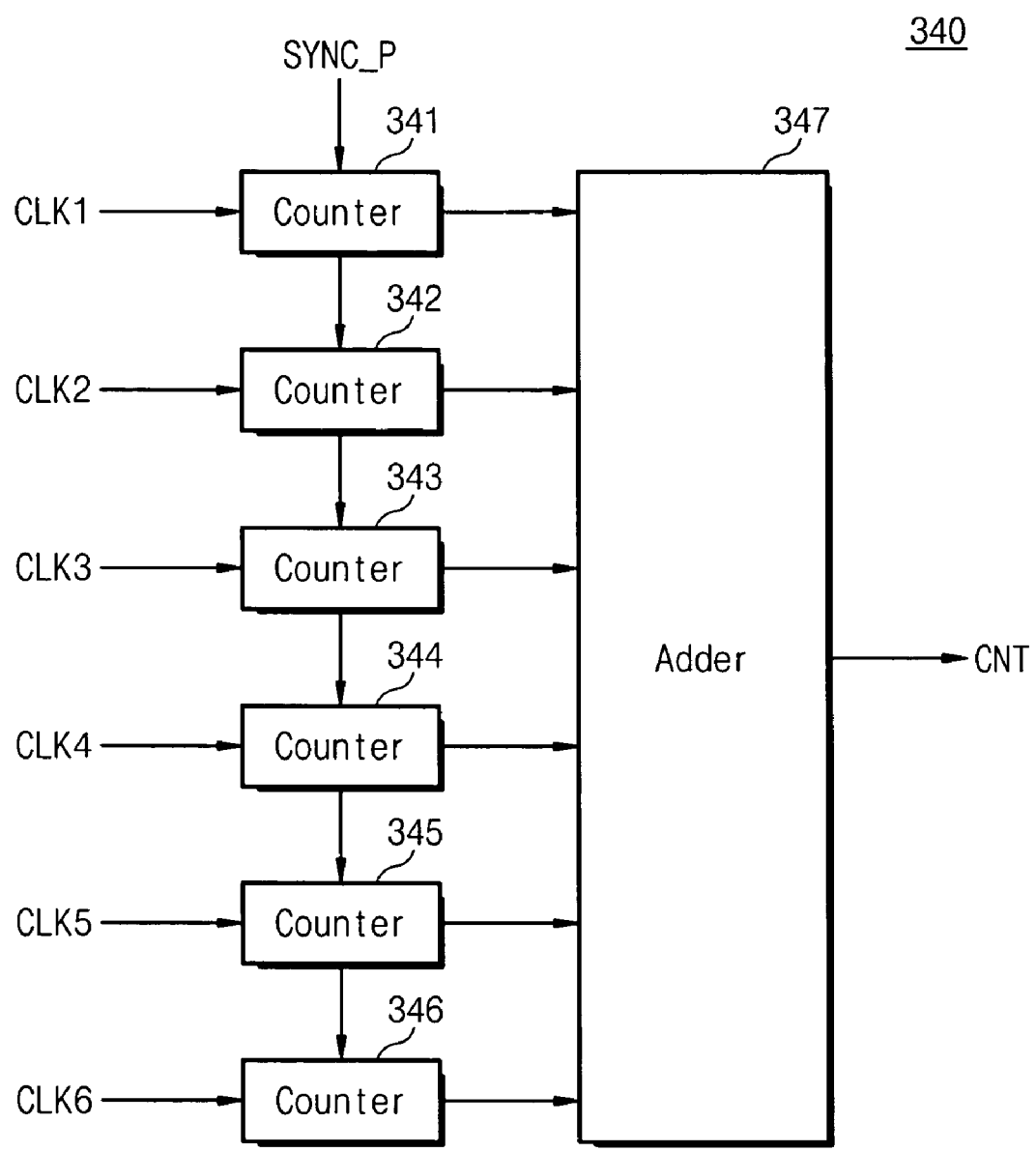
FIG. 9 illustrates a period counter of the period detector shown in FIG. 6.

FIG. 9 is a block diagram showing the period counter 340 of the period detector 320 shown in FIG. 6. With reference to FIG. 9, the period counter 340 includes six counters 341~346 for counting the six sampling clock signals CLK1~CLK6, respectively, and an adder 347. The counters 341~346 count the pulse number of the inputted clock signals while the synchronous pattern signal SYNC_P is a logic '1', respectively. Because the frequency of each of the sampling clock signals CLK1~CLK6 is higher than that of the internal clock signal I_CLK by 8, a sum CNT of the pulse number of the six sampling clock signals CLK1~CLK6 while the synchronous pattern signal SYNC_P is a logic '1', is identical to the pulse number obtained by sampling the synchronous pattern signal SYNC_P by a signal having a frequency (e.g., 8*6=48) times higher than that of the internal clock signal I_CLK.

As described above with reference to FIG. 6, when the synchronous pattern signal SYNC_P has an interval represented by a logic '1', it has a period of 666.6 ns±0.25%=666.6 ns±116 ps. A period of one symbol of the synchronous pattern signal SYNC_P is 83.3 ns±200 ps. In other words, one period of a USB transmission clock signal USB_TX_CLK that the clock generator circuit 300 generates is 83.3 ns±200 ps. When the clock signal generator circuit 300 produces a clock signal having a period of 10.41 ns±25 ps, it divides the clock signal having the period of 10.41 ns±25 ps to obtain a transmission clock signal USB_TX_CLK having a period of 838.3 ns±200 ps.

When a period of the generated clock signal is 10.375 ns, which has the minimum value of 10.41 ns±25 ps, and the synchronous pattern signal SYNC_P is a logic '1', pulses of 666.6/10.375=64.25 ns are present. In contrast, when a period of the generated clock signal is 10.425 ns, which has a maximum value of 10.41 ns±25 ps, and the synchronous pattern signal SYNC_P is a logic '1', pulses of 666.6/10.425=63.94 ns are present. Consequently, an error of 64.25 ns-63.94 ns, that is, about 0.3 ns, is present. So, to differentiate an error of about 0.3 ns, an order of about 0.16 must be differentiated by generating sampling clock signals CLK1~CLK6 having six phases from a signal having a period of 10.41 ns±25 ps.

A 48-frequency division phase locked loop (PLL) can be substituted for the multiple phase generator 330 shown in FIG. 6. However, a high frequency PLL typically leads to difficulties when designing an IC. Thus, according to a preferred embodiment of the present invention, an 8-frequency division PLL may be used in place of the 48-frequency division PLL for generating the sampling clock signals CLK1~CLK6 having different phases, thereby enabling an easier design process for an IC.

Referring back to FIG. 6, the control logic 360 outputs coefficients N and K corresponding to a sum of the number of pulses to a fractional frequency divider (e.g., a fractional-N PLL) 370. The coefficients N and K correspond to the sum of the number of pulses stored in a table 361. The table 361 is formed by a storage device such as a Read Only Memory (ROM). The control logic 360 may be composed of logic gates without the table 361 to output the coefficients N and K corresponding to a sum of the number of pulses. The control logic 360 can be modified in various forms.

Figure 11:
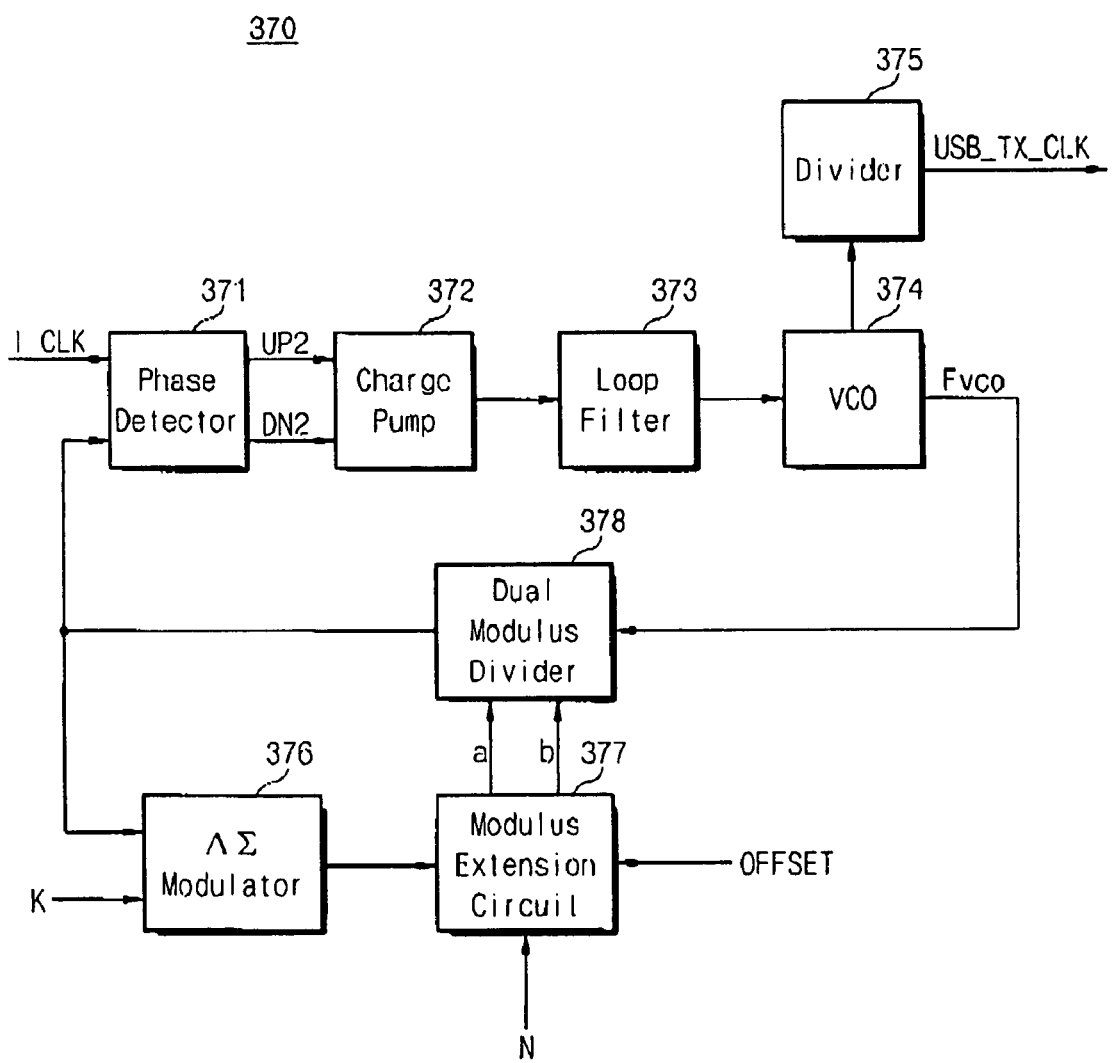
FIG. 11 illustrates a fractional-N phase locked loop (PLL)

The fractional frequency divider 370 frequency-divides the internal clock signal I_CLK by a frequency division ratio corresponding to the coefficients N and K, and outputs a USB transmission clock signal USB_TX_CLK having a frequency of, for example, 12 MHz±0.25%. FIG. 11 illustrates the fractional frequency divider 370 in detail. Referring to FIG. 11, the fractional frequency divider 370 includes a phase detector 371, a charge pump 372, a loop filter 373, a VCO 374, a frequency divider 375, a delta sigma modulator 376, a modulus extension circuit 377, and a dual modulus divider 378. The phase detector 371 compares a phase of a feedback clock signal from the dual modulus divider 378 with a phase of the internal clock signal I_CLK from the internal clock source 310, and outputs phase difference signals UP2 and DN2. The charge pump 372 adjusts a charge to be supplied to the loop filter 373 according to the phase difference signals UP2 and DN2 from the phase detector 371. The loop filter 373 generates a DC voltage proportional to the charge from the charge pump 372. The VCO 374 outputs a clock signal $F_{VCO}$ of a frequency corresponding to the DC voltage from the loop filter 373.

The fractional frequency divider 370 fractionally divides the internal clock signal I_CLK based on the coefficients N and K corresponding to a sum of the number of pulses outputted from the period counter 340. In general, a frequency divider embodied by a digital flip-flop circuit has a frequency division ratio of $2^n$ such as 2, 4, 8, 16 . . . . In a preferred embodiment of the present invention, the fractional frequency divider 370 may frequency-divide a clock signal by a natural number frequency division ratio, a fractional frequency division ratio, or as an exponential number frequency division (e.g., $2^n$).

If the frequency division ratio of the dual modulus frequency divider 378 is 'pa+b', by fixing a value of 'p' and adjusting 'a' and 'b', where for example (0≦b≦a), clock signals having natural frequency division ratios can be obtained. A clock signal having a fractional (or decimal) frequency division ratio may be obtained by periodically changing 'b' by means of the delta sigma modulator 376.

When a frequency of the internal clock signal I_CLK is 10.41 MHz±14% and a desired frequency $F_{VCO}$ is =12 MHz±0.25%, the table 361 with respect to a frequency division ratio coefficient N+K/F according to the frequency of the internal clock signal I_CLK is shown in FIG. 12. The frequency $F_{VCO}$ is expressed by the following equation $$F_{VCO}=F_{I\_CLK}(N+K/F)$$ [Equation 2]

where, N, K, and F are positive integers.

Referring back to FIG. 10, if a period of the internal clock signal I_CLK is T1, and each frequency of the sampling clock signals CLK1~CLK6 is T2. Then, while the synchronous pattern signal SYNC_P is a logic '1', a divisor is obtained from T1/10.41 ns by using a sum CNT (=(666.6 ns/T2)*6) of the number of pulses in the sampling clock signals CLK1~CLK6. For example, when the sum CNT of the number of pulses in the sampling clock signals CLK1~CLK6 obtained by the period counter 340 is, for example, 381, the control logic 360 outputs 8 and 18 as the coefficients N and K, respectively.

In Equation 2, when the delta sigma modulator 376 is designed with 8 bits, $F_{VCO}=F_{I\_CLK}(N+K/2^8)$, and a resolution is $1/2^8=1/256=0.0039$. When K=18, the delta sigm modulator 376 sequentially outputs 1 by 18, and 0 by 238 (e.g., 256−18=238). The modulus extension circuit 377 receives N from the division table 361 and a 0 or 1 from the delta sigma modulator 376, and outputs 'a' and 'b'. For example, when N=8 and p=2, a=4. Then 'b' is set to 0 or 1 by the delta sigma modulator 376. The dual modulus divider 378 obtains 'pa+b' based on 'a' and 'b' from the modulus extension circuit 377. The dual modulus divider 378 also frequency-divides and outputs an output signal $F_{VCO}$ of the VCO 374 by 'pa+b' to the phase detector 371. When N=8 and K=18, the output signal $F_{VCO}$ of the VCO 374 is (e.g., 8+18/256 times) frequency-divided by repeating operations of the delta sigma modulator 376, the modulus extension circuit 377, and the dual modulus divider 378.

The clock signal generator circuit 300 may obtain a transmission clock signal USB_TX_CLK of a desired frequency without having to lower a frequency of the internal clock signal I_CLK by means of the fractional frequency divider 370. Accordingly, the loop filter 373 having a wide bandwidth can be designed to have a fast looking time. Thus, when the frequency of the internal clock signal I_CLK is higher than a desired frequency due to a peripheral temperature or a power supply voltage, a sum of the number of pulses outputted from the period detector 320 is reduced resulting in an increase of a value of the coefficient K. In contrast, when the frequency of the internal clock signal I_CLK is lower than a desired frequency, the sum of the number of pulses outputted from the period detector 320 increases, thus resulting in a decrease of a value of the coefficient K, whereby a frequency of the output signal $F_{VCO}$ of the VCO 374 is maintained at a constant value. In other words, although external circumstances such as a temperature or a power supply voltage may vary, the frequency of the output signal $F_{VCO}$ of the VCO 374 is kept constant. The frequency divider 375 8-frequency divides the output signal $F_{VCO}$ of the VCO 374 and outputs the frequency-divided signals as the transmission clock signal USB_TX_CLK. The transmitter 230 shown in FIG. 1 transmits data to the host computer 100 through the USB 10 in synchronism with the transmission clock signal USB_TX_CLK.

When a frequency change range of the internal clock signal I_CLK generated by the internal clock source 310 is large, a value of the coefficient N as well as a value of the coefficient K should be changed. This causes the control logic 360 to be complex in design. To simplify the design of the control logic 360 an offset register 350 as shown in FIG. 6 is provided to change the coefficient K value.

FIG. 13 is a flowchart illustrating a method for generating a transmission clock signal according to another preferred embodiment of the present invention. Referring to FIGS. 6 and 13, the internal clock source 310 produces an internal clock signal I_CLK (step S400). The period detector 320 receives the internal clock signal I_CLK from the internal clock source 310, generates a plurality of sampling clock signals having different phases, samples a synchronous pattern signal SYNC_P, and detects a period of the internal clock signal I_CLK from the number CNT of pulses of the sampled signal (step S410). The period detector 320 further generates coefficients N and K corresponding to the detected period of the internal clock signal I_CLK (step S420). The fractional frequency divider 370 outputs a frequency division ratio 'pa+b' corresponding to the coefficients N and K (step S430), and multiplies the internal clock signal I_CLK by the frequency division ratio 'pa+b' to output a transmission clock signal USB_TX_CLK (step S440).

FIG. 14 is a table that shows changes of the number CNT of sampling pulses CNT and a frequency division ratio N+K/F according to a frequency of an internal clock signal I_CLK generated by the internal clock source 310 shown in FIG. 6. When the frequency of the internal clock signal I_CLK increases, the number CNT of sampling pulses decreases, causing an increase in the frequency division ratio N+K/F. In contrast, when the frequency of internal clock signal I_CLK decreases, the number CNT of sampling pulses increases, causing a decrease in the frequency division ratio N+K/F. Thus allowing the clock signal generator circuit 300 of FIG. 6 to form a negative feedback. As a result, the clock signal generator circuit 300 may obtain a stable frequency.

Figure 15:
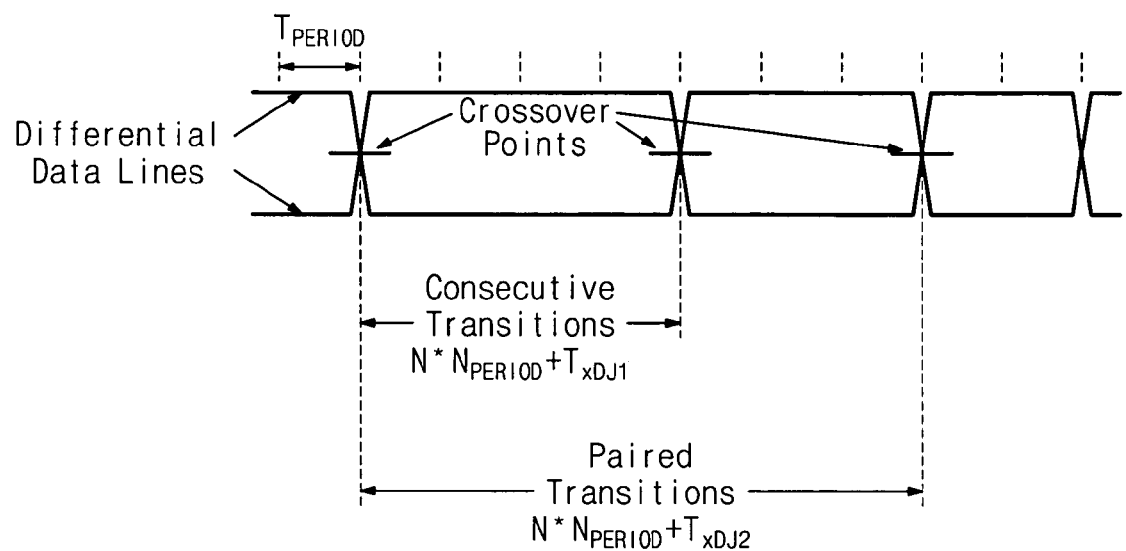
FIG. 15 illustrates a jitter specification of a USB transmission clock signal that is used in accordance with a preferred embodiment of the present invention.

A jitter specification of a USB transmission clock signal USB_TX_CLK for use with a preferred embodiment of the present invention will now be discussed with reference to FIG. 15. As shown in FIG. 15, a transmission speed of a transmission/reception signal is, for example, 12 MHz±0.25%, and a jitter of a consecutive transition is $N*T_{PERIOD}+T_{XDJ1}$. According to, for example, the USB 2.0 standard, when a logic '1' is continuously present for 6 transitions, it is regulated to stuff a logic '0'. In this case, the jitter of a consecutive transition is $7*T_{PERIOD}\pm3.5$ ns, and because a transmission jitter of a JK pair is $N*T_{PERIOD}+T_{XDJ2}$, the jitter of a consecutive transition becomes $14*T_{PERIOD}\pm4$ ns.

According to a preferred embodiment of the present invention, a clock signal suitable for USB communication, according to USB standards such as the USB 2.0 standard, can be produced by a clock signal generator circuit without using a precision clock generator such as a crystal oscillator. In addition, the clock signal generator circuit can be used in an electronic device for producing a stable clock signal suitable for serial bus communication. Further, the clock signal generator circuit can be used in an IC card capable of communicating with a host computer through a USB.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A clock signal generator circuit comprising:
    a first clock generator for generating a first clock signal;
    a period detector for detecting a period of the first clock signal from the first clock generator, and for generating a control code according to the detected period; and
    a second clock generator for receiving the first clock signal from the first clock generator, and for generating a second clock signal according to the control code received from the period detector, wherein the second clock generator includes a fractional phase locked loop (PLL) for frequency-dividing the first clock signal by a frequency division ratio corresponding to the control code and for outputting the divided clock signal as a clock signal.

2. The clock signal generator circuit of claim 1, wherein the period detector includes:
    a sampling clock signal generator for receiving the first clock signal from the first clock signal generator and for generating a plurality of sampling clock signals having different respective phases; and
    control logic for sampling a synchronous signal from a host computer by using the sampling clock signals from the sampling clock signal generator, and for generating the control code corresponding to the sampled signal.

3. The clock signal generator circuit of claim 2, wherein each of the sampling clocks has a frequency higher than the first clock signal.

4. The clock signal generator circuit of claim 2, wherein the control logic includes a storage device for storing a plurality of control codes.

5. The clock signal generator circuit of claim 4, wherein the control logic outputs a control code corresponding to the sampled signal from the plurality of control codes stored therein.

6. The clock signal generator circuit of claim 2, wherein the control logic outputs a control code from a plurality of control codes corresponding to a sum of a pulse number of the sampling clock signals while the synchronous signal is at a first level.

7. The clock signal generator circuit of claim 1, wherein the frequency division ratio includes a coefficient N (where N is a positive integer) corresponding to an integer frequency division ratio and a coefficient K (where K is a positive integer) corresponding to a fractional frequency division ratio.

8. The clock signal generator circuit of claim 7, wherein the frequency division ratio of the fractional PLL is N+(K/F) (where N, K, and F are integers).

9. The clock signal generator circuit of claim 1, wherein the first clock generator is a resistor-capacitor (RC) oscillator.

10. The clock signal generator circuit of claim 1, wherein the clock signal generator circuit is located on an integrated circuit (IC) card for communicating with a host computer through a serial bus.

11. The clock signal generator circuit of claim 10, wherein the serial bus is a Universal Serial Bus (USB).

12. An electronic device comprising:
a first clock generator for generating a first clock signal;
a sampling clock signal generator for receiving the first clock signal from the first clock generator and for generating a plurality of sampling clock signals having different phases;
control logic for sampling a synchronous signal from a host computer by using the sampling clock signals from the sampling clock signal generator, and for generating a control code corresponding to the sampled signal; and
a second clock generator for receiving the first clock signal from the first clock generator, and for generating a second clock signal according to the control code from the control logic.

13. The electronic device of claim 12, wherein the second clock generator includes a fractional phase locked loop (PLL) for multiplying the first clock signal a real number of times by a frequency division ratio corresponding to the control code and for outputting a clock signal having a predetermined frequency.

14. The electronic device of claim 12, wherein the electronic device is an integrated circuit (IC) card.

15. A smart card for communicating with a host computer through a serial bus, the smart card comprising:
a receiver for receiving a synchronous signal from the host computer through the serial bus;
a clock signal generator circuit for receiving the synchronous signal and for generating a transmission clock signal; and
a transmitter for transmitting data to the host computer through the serial bus in synchronism with the transmission clock signal from the clock signal generator circuit,
wherein the clock signal generator circuit includes:
an internal clock generator for generating an internal clock signal;
a period detector for detecting a period of the internal clock signal from the internal clock generator, and for generating a control code according to the detected result; and
a transmission clock generator for receiving the internal clock signal from the internal clock generator, and for generating the transmission clock signal according to the control code from the period detector, wherein the second clock generator includes a fractional phase locked loop (PLL) for frequency-dividing the first clock signal by a frequency division ratio corresponding to the control code and for outputting the divided clock signal as a clock signal.

16. The smart card of claim 15, wherein the period detector includes:
a first phase locked loop (PLL) for receiving the internal clock signal from the internal clock generator and for generating a plurality of sampling clock signals having different respective phases;
counters for counting periods of the sampling clock signals from the first PLL during an activation interval of the synchronous signal;
an adder for adding the periods of the sampling clock signals counted by the counters; and control logic for outputting the control code corresponding to an output of the adder.

17. The smart card of claim 16, wherein the first PLL is an integer PLL.

18. The smart card of claim 17, wherein the first PLL includes a differential ring oscillator for generating a plurality of sampling clock signals having different respective phases.

19. A method for generating a transmission clock signal, comprising the steps of:
generating an internal clock signal using a first clock generator;
detecting a period of the internal clock signal, and generating a control code according to the detected period; and
receiving the internal clock signal from the first clock generator and generating a transmission clock signal using a second clock generator according to the control code, wherein the second clock generator includes a fractional phase locked loop (PLL) for frequency-dividing the internal clock signal by a fractional frequency division ratio corresponding to the control code and outputting the divided internal clock signal as the transmission clock signal.

20. A method for controlling a smart cart that communicates with a host computer through a serial bus, the method comprising the steps of:
receiving a synchronous signal from the host computer through the serial bus;
generating an internal clock signal using a first clock generator;
detecting a period of the internal clock signal by using the synchronous signal, and generating a control code according to the detected period;
receiving the internal clock signal from the first clock generator, and multiplying the received internal clock signal by a ratio according to the control code and using a second clock generator to generate a transmission clock signal, wherein the second clock generator includes a fractional phase locked loop (PLL) for frequency-dividing the internal clock signal by a fractional frequency division ratio corresponding to the control code and outputting the divided internal clock signal as the transmission clock signal; and
transmitting data to the host computer through the serial bus in synchronism with the transmission clock signal.

* * * * *